(12) United States Patent
Ecker (10) Patent No.: US 9,123,446 B1
(45) Date of Patent: Sep. 1, 2015

(54) METHOD AND APPARATUS FOR MEMORY SPEED CHARACTERIZATION

(75) Inventor: Reuven Ecker, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 240 days.

(21) Appl. No.: 13/584,217

(22) Filed: Aug. 13, 2012

Related U.S. Application Data

(60) Provisional application No. 61/524,588, filed on Aug. 17, 2011.

(51) Int. Cl.
*G11C 29/50* (2006.01)

(52) U.S. Cl.
CPC .......... *G11C 29/50012* (2013.01); *G11C 29/50* (2013.01)

(58) Field of Classification Search
CPC .............. G11C 7/22; G11C 7/06; G11C 7/12; G11C 7/1051; H03K 3/03
USPC ................. 365/189.011, 189.14, 201; 331/57, 331/108 C; 713/300
See application file for complete search history.

(56) References Cited

U.S. PATENT DOCUMENTS

| | | | | |
|---|---|---|---|---|
| 5,818,250 A * | 10/1998 | Yeung et al. | ............. | 324/762.02 |
| 7,684,263 B2 * | 3/2010 | Adams et al. | ............. | 365/189.14 |
| 7,793,119 B2 * | 9/2010 | Gammie et al. | ............. | 713/300 |
| 8,370,654 B1 | 2/2013 | Hasko et al. | | |
| 8,553,442 B2 | 10/2013 | Rotem | | |
| 2004/0061561 A1 * | 4/2004 | Monzel et al. | ................... | 331/57 |
| 2006/0097802 A1 * | 5/2006 | Chan et al. | ..................... | 331/57 |
| 2007/0237012 A1 * | 10/2007 | Kuang et al. | .................. | 365/201 |
| 2013/0222071 A1 * | 8/2013 | Chuang et al. | .................. | 331/57 |

* cited by examiner

*Primary Examiner* — Richard Elms
*Assistant Examiner* — Ajay Ojha (57) ABSTRACT

Aspects of the disclosure provide an integrated circuit. The integrated circuit includes a memory array, a ring oscillator and a speed determination circuit. The memory array is defined by a plurality of memory cells that are based on a memory cell design. The ring oscillator has a plurality of inversion stages formed of a plurality of modified memory cells based on the memory cell design. The speed determination circuit is configured to determine a speed of the ring oscillator.

20 Claims, 5 Drawing Sheets

METHOD AND APPARATUS FOR MEMORY SPEED CHARACTERIZATION

INCORPORATION BY REFERENCE

This present disclosure claims the benefit of U.S. Provisional Application No. 61/524,588, "SRAM Speed Characterization" filed on Aug. 17, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Memory arrays, such as static random access memory (SRAM) array, and the like, are of wide usages in silicon devices. Transistors in a memory array can have different characteristics than transistors in a regular logic circuit. In an example, in order to achieve high density, layout of the transistors in a memory array can violate regular layout design rules and have different levels of implantation, and thus the transistors in the memory array have different characteristics than transistors in a regular logic circuit that follow the regular design rules.

SUMMARY

Aspects of the disclosure provide an integrated circuit. The integrated circuit includes a memory array, a ring oscillator and a speed determination circuit. The memory array is defined by a plurality of memory cells that are based on a memory cell design. The ring oscillator has a plurality of inversion stages formed of a plurality of modified memory cells based on the memory cell design. The speed determination circuit is configured to determine a speed of the ring oscillator. In an embodiment, a speed of the memory array is determined based on the speed of the ring oscillator.

Further, in an embodiment, the integrated circuit includes an adaptive voltage scaling module configured to generate a feedback signal based on the determined speed. The feedback signal is provided to a voltage regulator to cause the voltage regulator to adjust a supply voltage to the memory array based on the feedback signal.

In an example, the memory cell design is a six-transistor static random access memory (SRAM) cell design that includes two pass transistors coupled to bit lines, and a latch formed by two cross-coupled inverters. Further, in an embodiment, the plurality of inversion stages are modified from a plurality of memory cells sharing bit lines. In an example, the plurality of inversion stages are a differential type of inversion stages.

According to an aspect of the disclosure, the inversion stages have a same pattern as the memory cells in circuit layers up to a metal layer.

Further, in an embodiment, the speed determination circuit is configured to count a number of inversions during a time interval.

Aspects of the disclosure provide an apparatus that includes the integrated circuit and the voltage regulator.

Aspects of the disclosure also provide a method. The method includes measuring a speed of a ring oscillator that is formed by modifying metal layers of a first memory array disposed on an integrated circuit (IC) chip with a second memory array, and using the measured speed as a memory speed indication of the second memory array.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
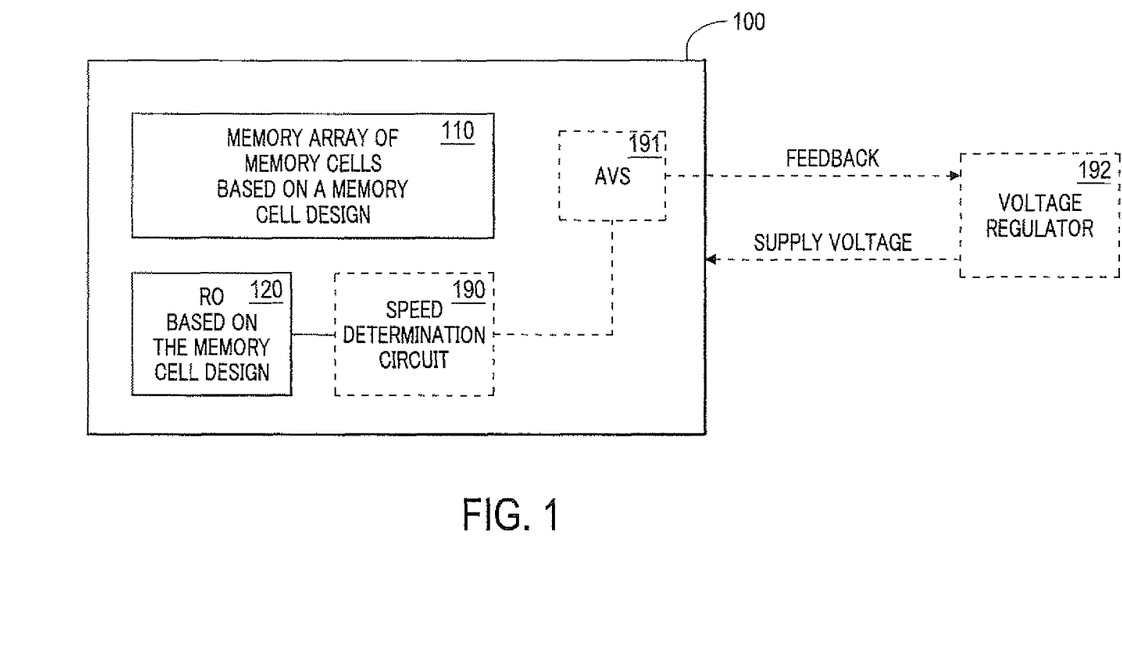
FIG. 1 shows a block diagram of an integrated circuit (IC) chip 100 according to an embodiment of the disclosure.

FIG. 1 shows a block diagram of an integrated circuit (IC) chip 100 according to an embodiment of the disclosure. The IC chip 100 includes a memory array 110 based on a memory cell design, and a ring oscillator (RO) 120 based on the same memory cell design. Further, in an embodiment, the IC chip 100 includes a speed determination circuit 190 coupled with the RO 120 to determine a speed of memory transistors based on the RO 120. It is noted that a speed of a memory device generally corresponds to the speed of transistors that it contains, in an embodiment. In addition, in an embodiment, the IC chip 100 includes an adaptive voltage scaling (AVS) module 191 configured to generate a feedback signal as a function of at least the memory transistors speed. In an example, the feedback signal is provided to an internal voltage regulator (not shown) in the IC chip 100 or an external voltage regulator 192 out of the IC chip 100 that can cause a supply voltage to the IC chip 100 to be adjusted based on the feedback signal. Then, the adjustment in the supply voltage to the IC chip 100 causes a change in a supply voltage to the memory array 110. Various aspects of AVS module 191 are similar in operation and functionality to the adaptive voltage scaling module described in Assignees co-pending U.S. patent application Ser. No. 12/730,829 filed on Mar. 24, 2010, which is incorporated herein by reference in its entirety.

According to an aspect of the disclosure, the memory array 110 includes a plurality of memory cells arranged in rows and columns. The RO 120 includes a plurality of inversion stages coupled together in a loop. The memory cells of the memory array 110 and the inversion stages of the RO 120 are based on the same memory cell design, such that the transistor characteristics in the inversion stages are about the same as the transistor characteristics in the memory cells, and the frequency of the RO 120 is indicative of the memory operation speed, such as read speed, write speed, and the like.

Generally, an IC is fabricated according to a layout of the IC to form patterned layers into and onto a silicon substrate. The layout defines the patterns in each of the layers to form the IC. In an example, a layout of a memory array includes a memory cell design for defining patterns in layers up to a lower metal layer, such as a first metal layer, to form each of the memory cells. In addition, the layout of the memory array includes a connection design for defining patterns in upper metal layers, such as a second metal layer and a third metal layer, that interconnect the memory cells and connect the memory cells to peripheral circuit and power grid.

Specifically, in an example, a memory cell design defines patterns in well, active layer, poly layer, contact layer and a first metal layer that form transistors in the memory cell and interconnection of the transistors in the memory cell. The connection design defines patterns in a first via layer, a second metal layer, a second via layer, and a third metal layer that interconnect the memory cells and connect the memory cells to peripheral circuit and power grid.

Further, according to an aspect of the disclosure, memory cell design can be special compared to logic circuit. For example, in order to achieve high memory density, the layout of the transistors in a memory array violates regular layout design rules, such as minimum distance rules, and the like used for logic circuit design. In another example, a design uses one or more additional masks to provide different ion implantation levels to transistors in the memory array compared to transistors in the logic circuit.

In addition, in an embodiment, the memory cell design can be tuned for a specific fabrication facility. In an example, a memory cell design is optimized based on the fabrication process of a fabrication facility to achieve, for example, a combination of a relatively high memory density, a relatively high yield, and a relatively good performance. Then, the fabrication facility provides the optimized memory cell design to customers and prefers that the customers to use the optimized memory cell design in an IC that is intended to be manufactured in the fabrication facility. A customer can use the optimized memory cell design, and apply his own connection design (e.g., patterns in upper metal layers) to suit the needs in his IC. It is noted that, in an example, while the memory cell design does not follow the regular layer design rule, the connection design and the rest of the IC, such as peripheral circuit of a memory array, logic circuit, functional circuit, and the like, follow the regular design rules.

According to an embodiment of the disclosure, the inversion stages in the RO 120 are based on the same memory cell design used in the memory array 110. In an example, an inversion stage has same patterns as a memory cell in layers up to the first metal layer, such as layers from well to the first metal layer that form the transistors and interconnection of the transistors in a memory cell. Modifications are made in the connection design, such as in the second metal layer and the third metal layer, to form the RO 120. Thus, the transistor characteristics of the inversion stages are about the same as the transistor characteristics of the memory cells, and a speed of the RO 120 is indicative of a speed of the memory cell.

It is noted that, in an embodiment, the RO 120 includes suitable features of ring oscillator based speed monitoring circuit. In an example, the RO 120 is gated by an enable signal. For example, the RO 120 is gated by a logical AND gate. The AND gate receives the enable signal and an output signal from an inversion stage, performs a logical AND operation of the enable signal and the output signal to generate a gated output signal, and provides the gated output signal as an input signal to a next inversion stage. Thus, in the example, the RO 120 is enabled to oscillate when the enable signal has a high voltage corresponding to logic "1," and is disabled and cannot oscillate when the enable signal has a low voltage corresponding to logic "0."

According to an aspect of the disclosure, a characteristic of the RO 120, such as a frequency of the RO 120, and the like, is measured and used as an indication of the speed of memory transistors, which in turn is indicative of a speed of the memory, in an embodiment.

In an example, the frequency of the RO 120 is used as an indication of memory speed of the memory array 110. The frequency is used in a testing process, in an embodiment, to determine whether the memory speed of the memory array 110 meets a speed specification, and to determine whether the IC chip 100 passes or fails the test.

In another example, the frequency of the RO 120 is used to bin ICs into different speed bins.

In another example, the frequency of the RO 120 is used for product engineering purpose. For example, parameters of a process, such as a lithography process, an implant process, and the like, are tuned based on at least the frequency of the RO 120 in one or more test devices.

In another example, the frequency of the RO 120 is used for circuit tuning purpose. For example, the IC chip 100 includes tunable components (not shown), such as fuse, one-time programmable memory, and the like that are used for tuning internal circuits on the IC chip 100. The tunable components are adjusted based on the frequency of the RO 120.

It is noted that, in an example, the frequency of the RO 120 is measured by an external testing device (not shown) that is out of the IC chip 100. In another example, the frequency of the RO 120 is measured by an internal component on the IC chip 100, such as the speed determination circuit 190, and the like. The internal component generates a signal, such as a digital signal, an analog signal, and the like, that is indicative of the frequency of the RO 120.

In an embodiment, the speed determination circuit 190 includes a counter that counts a number of inversions during a time period, such as during a predetermined number of clock cycles, and the like. In an example, clock cycles are generated with a stable timing component, such as an external crystal oscillator configured to provide relatively stable clock cycles. The number of inversions is indicative of inversion speed, which in turn is indicative of memory speed.

According to an embodiment of the disclosure, the frequency of the RO 120 is used for controlling an operation voltage on the IC chip 100 during chip operation to optimize speed, power and/or yield, such as in an adaptive voltage scaling (AVS) application disclosed in Assignee's co-pending U.S. patent application Ser. No. 12/730,829, filed Mar. 24, 2010, which is incorporated herein by reference in its entirety. In an example, the IC chip 100 is installed in an electronic system, and is suitably coupled with other components of the electronic system, such as a voltage regulator 192 that provides a supply voltage to the IC chip 100. During operation of the electronic system, the AVS module 191 generates a feedback signal based on at least the speed determined by the speed determination circuit 190. The feedback signal is provided to the voltage regulator 192 to cause the supply voltage to the IC chip 100 to be adjusted during operation. The adjustment in the supply voltage causes a change in the operation voltage of the memory array 110. In an embodiment, the supply voltage is governed in response to the determined speed of RO 120 in a manner to make the memory speed to fall within a desired range of acceptable speeds.

Figure 2A:
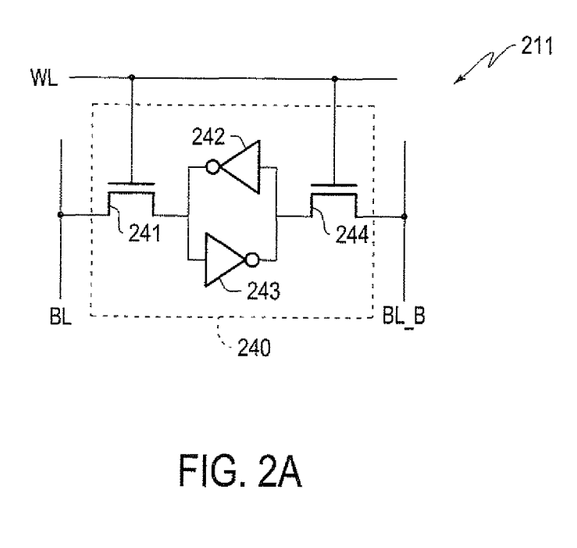
FIGS. 2A and 2B show a memory cell and an inversion stage based on a same memory cell design according to an embodiment of the disclosure.
Figure 2B:
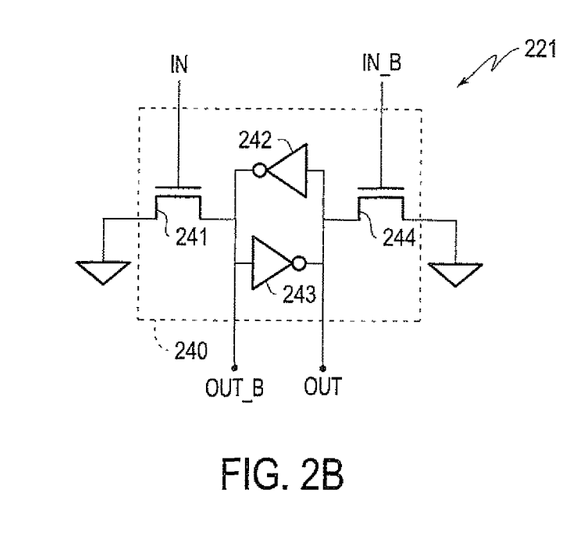

FIG. 2A shows a memory cell 211 based on a memory cell design 240, and FIG. 2B shows an inversion stage 221 based on the same memory cell design 240. In an example, the memory cell 211 is used in a memory array on an IC chip, such as the memory array 110 on the IC chip 100. Then, the inversion stage 221 is used in a ring oscillator on the same IC chip, such as the RO 120 on the IC chip 100, to monitor the memory speed. In an embodiment, corresponding transistors in the inversion stage 221 and the memory cell 211 have substantially the same sizes and the substantially the same levels of ion implantation.

In the FIG. 2A example, the memory cell 211 is an SRAM cell 211 based on a six-transistor (6T) SRAM cell design 240. The SRAM cell design 240 includes two pass transistors 241 and 244, and two cross-coupled inverters 242 and 243. These elements are coupled together as shown in FIG. 2A.

In FIG. 2A, each of the inverters 242 and 243 includes two transistors (not shown), an N-type metal-oxide-semiconductor (MOS) transistor and a P-type MOS transistor coupled together to form the inverter. Thus, the SRAM cell design 240 includes a total of six transistors.

The cross-coupled inverters 242 and 243 form a latch to maintain an internal state, such as a logic state. Each of the two pass transistors 241 and 244 has one channel terminal (source/drain terminal) connected to the cross-coupled inverters to enable or disable access to the internal state. For example, when the two pass transistors 241 and 244 are turned on, the internal state can be read out or can be changed. When the two pass transistors 241 and 244 are turned off, the internal state is self-maintained by the cross-coupled inverters 242 and 243.

According to an embodiment of the disclosure, the SRAM cell design 240 defines patterns up to the first metal layer in a fabrication process. The patterns up to the first metal layer form the six transistors and interconnections between the six transistors. Further, in the memory cell 211, connection design defines patterns in the second metal layer and the third metal layer to connect the SRAM cell design 240 to into the memory array. In the FIG. 2A example, the SRAM cell design 240 is connected to a word line (WL), and a pair of bit lines (BL and BL_B). Specifically, the gate terminals of the two pass transistors 241 and 244 are connected to the word line WL, and each of the pass transistors 241 and 244 has another channel terminal (source/drain terminal) connected to one of bit lines BL and BL_B.

During a read operation, when the word line WL is selected, such as having a relatively high voltage corresponding logic "1," the two pass transistors 241 and 242 are both turned on, a charge state on the bit lines BL and BL_B are changed based on the internal state of the memory cell 211. The change of the charge state can be amplified to determine the internal state of the memory cell 211.

During a write operation, the bit lines BL and BL_B are driven according to the state intended to be written to the memory cell 211. When the word line WL is selected, such as having a relatively high voltage corresponding to logic "1," the state is driven to the latch formed by the cross-coupled inverters 242 and 243, and is maintained as the internal state of the memory cell 211.

When the word line WL is unselected, such as having a relatively low voltage corresponding to logic "0," the two pass transistors 241 and 242 are turned off to disable access to the internal state.

In FIG. 2B, the inversion stage 221 is based on the six-transistor (6T) SRAM cell design 240 to form a differential inverter 221 that receives a pair of differential inputs (IN and IN_B) and generates a pair of differential outputs (OUT and OUT_B).

In the FIG. 2B example, the inversion stage 221 uses the same 6T SRAM cell design 240, and thus has the same patterns in up to the first metal layer, as the memory cell 211. The patterns in up to the first metal layers form the six transistors and interconnections between the six transistors. Further, connection design defines patterns in the second metal layer and the third metal layer to connect the SRAM cell design 240 into the ring oscillator. It is noted that the connection design (e.g., patterns in the second and third metal layers) of the inversion stage 221 is different from the connection design of the memory cell 211.

Specifically, within the 6T SRAM cell design 240, the two inverters 242 and 243 are still cross-coupled, and each of the two pass transistors 241 and 244 still has one channel terminal connected to the cross-coupled inverters 242 and 243. However, the gate terminals of the two pass transistors 241 and 244 respectively receive the pair of differential inputs IN and IN_B that are output from a previous inversion stage. Further, the two pass transistors 241 and 244 have the other channel terminals connected to ground. The cross-coupled inverters 242 and 243 generate the pair of differential outputs OUT and OUT_B.

During operation, in an example, when the input IN has a high voltage corresponding to logic "1" and the IN_B has a low voltage corresponding to logic "0," the pass transistor 241 is turned on and the pass transistor 244 is turned off. Thus, the output OUT_B has a low voltage corresponding to logic "0," and the output OUT has a high voltage corresponding to logic "1." When the input IN has a low voltage corresponding to logic "0" and the input IN_B has a high voltage corresponding to logic "1," the pass transistor 241 is turned off and the pass transistor 244 is turned on. Thus, the output OUT has a low voltage corresponding to logic "0" and the output OUT_B has a high voltage corresponding to logic "1."

In the FIG. 2B example, the output OUT_B is an inversion of the input IN, and the output OUT is an inversion of the input IN_B.

In an embodiment of the disclosure, a plurality of inversion stages 211 is coupled in a loop to form a ring oscillator. In an example, an odd number of inversion stages 211 are coupled in a loop to form a ring oscillator. For example, the output OUT of a stage is coupled to the input IN_B of the next stage, and the output OUT_B of the stage is coupled to the input IN of the next stage. It is noted that, because the inversion stage 211 is a differential type of inverter, a ring oscillator can include an even number of inversion stages 211 suitably coupled in a loop to enable oscillation.

According to an aspect of the disclosure, because the inversion stage 221 is based on the same memory cell design 240 as the memory cell 211, the inversion stage 221 and the memory cell 211 have same patterns in layers up to the first metal layer that form the six transistors and interconnections between the transistors. Thus, the transistor characteristics of the inversion stage 221 are about the same as the transistor characteristics of the memory cell 211.

Figure 3A:
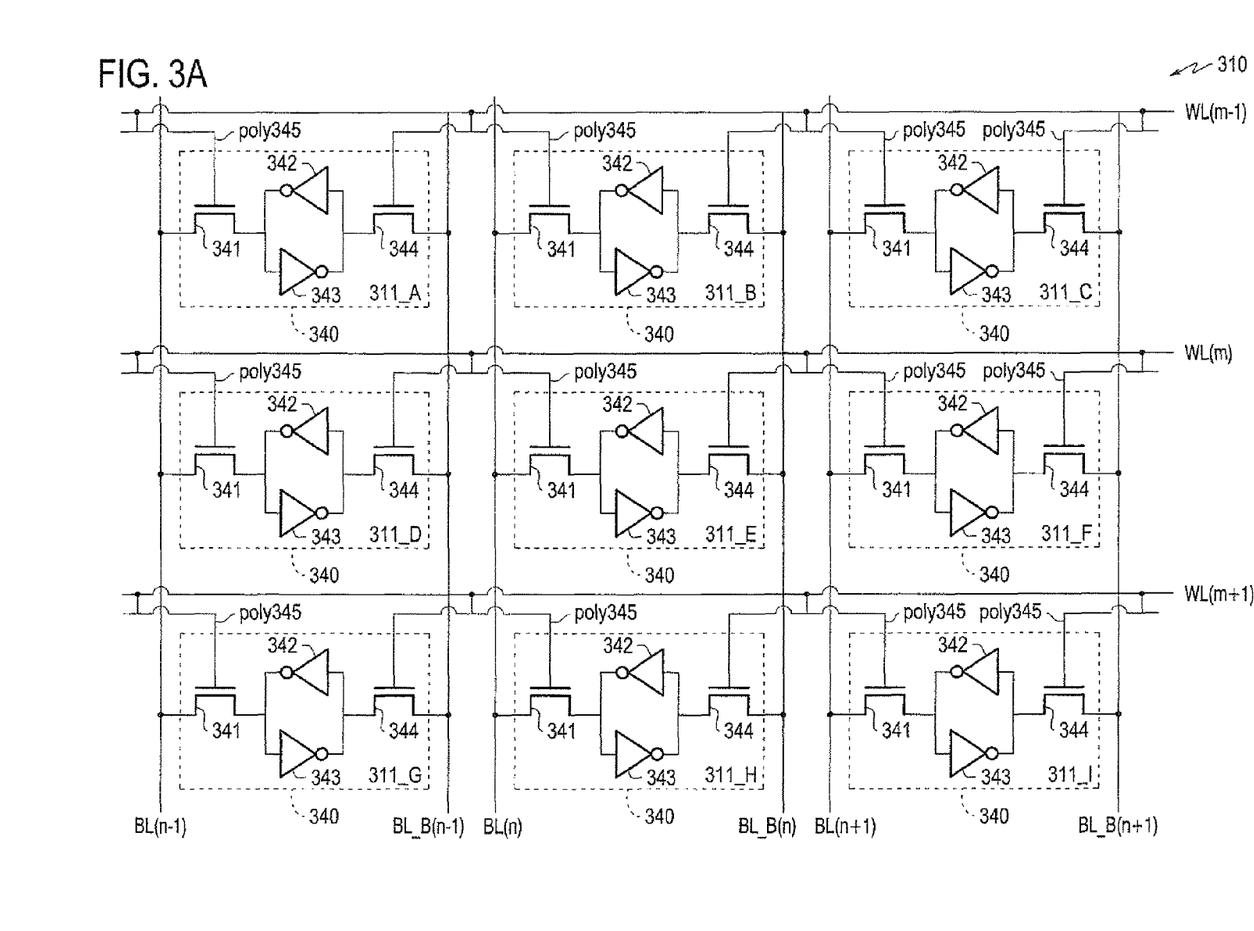
FIGS. 3A and 3B show respectively a portion of a memory array and a portion of a ring oscillator according to an embodiment of the disclosure.
Figure 3B:
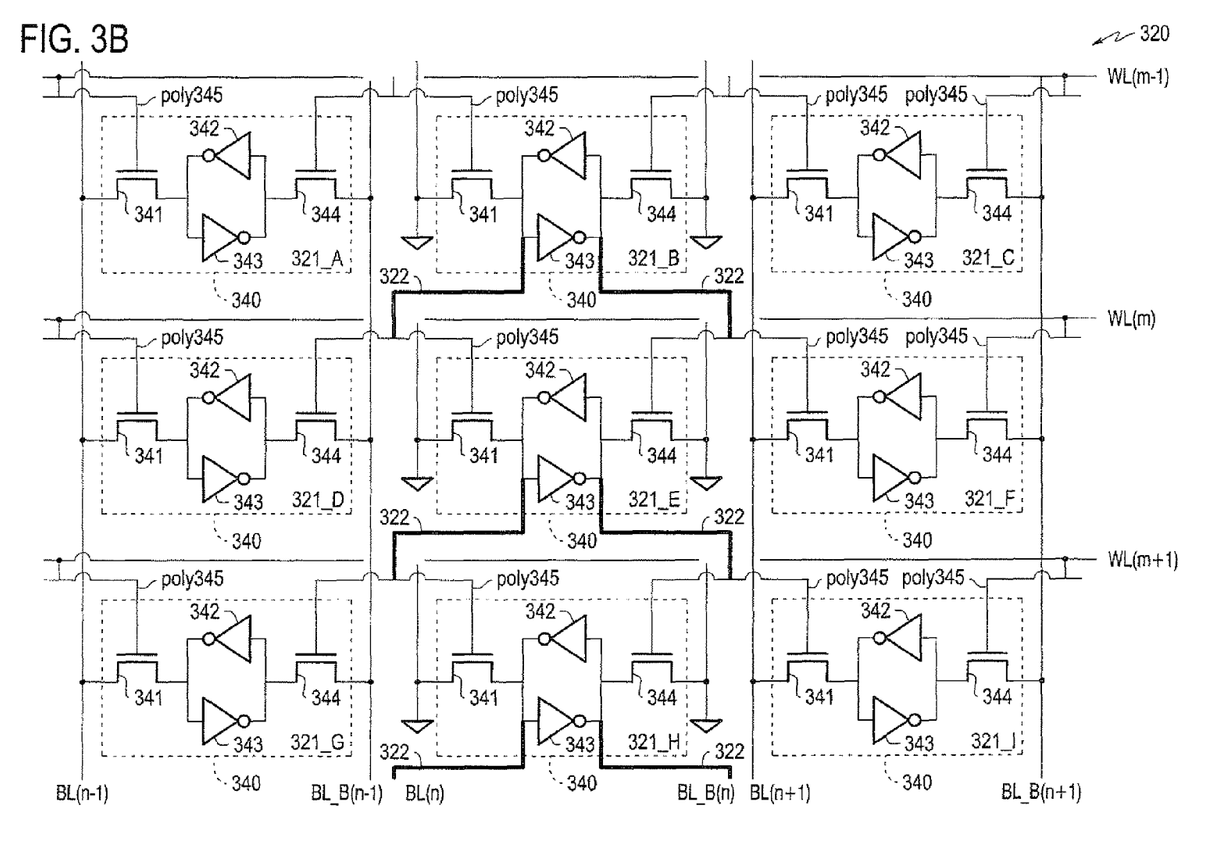

FIG. 3A shows a portion of a memory array 310 based on a memory cell design 340, and FIG. 3B shows a portion of a ring oscillator 320 based on the same memory cell design 440. The portion of the ring oscillator 320 has the same patterns in layers up to the first metal layer as the portion of the memory array 310. Thus, the transistor characteristics of the ring oscillator 320 are about the same as the transistor characteristics of the memory array 310.

In the FIG. 3A example, the memory array 310 includes a plurality of memory cells arranged in rows and columns to form the memory array 310. The memory cells are based memory cell design 340 that defines patterns in layers up to the first metal layer. Further, the memory array 310 includes connect design to connect the memory cells. Specifically, the memory array 310 includes word lines, such as WL(m−1), WL(m), WL(m+1), and the like, extending in the horizontal direction, and bit line pairs, such as BL(n−1) and BL_B(n−1), BL(n) and BL_B(n), BL(n+1) and BL_B(n+1), and the like, extending in the vertical direction. Each of the memory cells is connected to a word line and a pair of bit lines. Memory cells in a row are connected to a same word line, and memory cells in a column are connected to a same pair of bit lines.

The memory cell design 340 operates similarly to the SRAM cell design 240 described above. The memory cell design 340 also utilizes certain components that are identical or equivalent to those used in the SRAM cell design 240; the description of these components has been provided above and will be omitted here for clarity purposes In the FIG. 3A example, the memory cell design 340 defines poly gate to be shared between memory cells in adjacent columns, as seen as poly 345. For example, the pass transistor 341 in memory cell 311_B and the pass transistor 344 in memory cell 311_A share poly gate and the pass transistor 344 in memory cell 311_B and the pass transistor 341 in the memory cell 311_C share poly gate.

Further, in an example, the memory cell design 340 is implemented using layers up to the first metal layer. The memory array 310 includes the connection design to define patterns in the second metal layer and the third metal layer to connect the memory cell design 340 into the memory array. In an example, the bit line and high voltage power grid are implemented using the second metal layer, and the word lines and ground connection grid are implemented using the third metal layer. It is noted that the high voltage power grid and the ground connection grid are not shown for clarity. In an example, a majority of ground connection grid is parallel to the word line, and a majority of the high voltage power grid is parallel to the bit lines.

According to an aspect of the disclosure, the memory cell design 340 follows specific rules that may violate regular design rules that are used in other circuit design, such as logic circuit design, functional circuit design, and the like, in order to improve memory density and suit a fabrication process.

In FIG. 3B, the portion of the ring oscillator 320 are based on the same memory cell design 340. In an example, the portion of the ring oscillator 320 has the same patterns as the portion of memory array 310 in layers up to the first metal layer. Further, the portion of the ring oscillator 320 has modifications in the second metal layer and the third metal layer compared to the portion of the memory array 310, in an embodiment. It is noted that other upper metal layers (not shown), such as a fourth metal layer, a fifth metal layer, and the like, can have the same or different patterns in the ring oscillator 320 and the memory array 310.

Specifically, the portion of the ring oscillator 320 includes three columns. The middle column forms inversion stages, such as inversion stages 321_B, 321_E and 321_H. The other two columns are included in the ring oscillator 320 to keep the poly gate patterns of the middle column to be the same as the poly gate patters of the memory cells in the memory array 310.

Further, in an example, the bit lines BL(n) and BL_B(n) in the second metal layer are suitably broken and are respectively tied to the ground connection grid in the third metal layer. The word lines WL(m-1), WL(m) and WL(m+1) are broken to untie the gate terminals of two pass transistors in the same memory cell. Thus, the middle column forms inversion stages 321_B, 321_E and 321_H, and the like. The inversion stages 321_B, 321_E and 321_H operate similarly to the inversion stage 221 described above. The inversion stages 321_B, 321_B and 321_H also utilize certain components that are identical or equivalent to those used in the inversion stage 221; the description of these components has been provided above and will be omitted here for clarity purposes Further, in an example, a plurality of inversion stages is connected in a loop to form the ring oscillator. For example, the differential outputs of the inversion stage 321_B are connected to the differential inputs of the inversion stage 3213, and the differential outputs of the inversion stage 321_B are connected to the differential inputs of the inversion stage 321_H using the second metal layer, as seen by 322. Because the bit lines are broken, routing resources are available in the second metal layer, in an embodiment, to connect the inversion stages into a ring form a ring oscillator.

It is noted that, in the FIG. 3B example, the patterns in the second metal layer and the third metal layer are modified from the patterns in the FIG. 3A example so as to minimize pattern changes of an inversion stage in comparison to a memory cell. It is noted that, in another example, the second metal layer and the third metal layer of the ring oscillator can be re-routed to have different patterns from the second metal layer and the third metal layer of the memory array.

Figure 4:
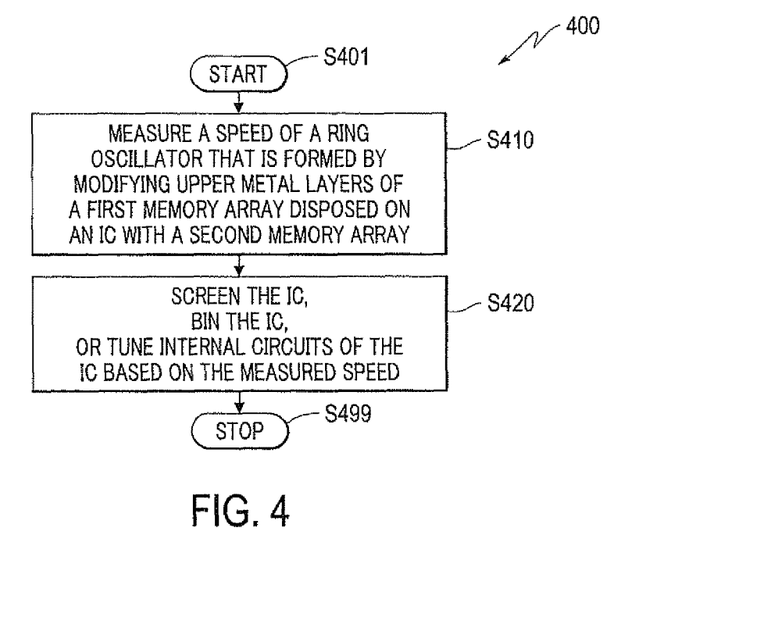
FIG. 4 shows a flow chart outlining a process 400 according to an embodiment of the disclosure.

FIG. 4 shows a flow chart outlining a process 400 according to an embodiment of the disclosure. The process starts at S401 and proceeds to S410.

At S410, a speed of a ring oscillator is measured. The ring oscillator is formed by modifying upper metal layers of a first memory array. The ring oscillator is disposed on an IC chip with a second memory array. The memory cells in the second memory array have same patterns as the inversion stage in the ring oscillator in layers up to a lower metal layer. Thus, transistor characteristics of the ring oscillator are about the same as the transistor characteristics of the memory cells, and the speed of the ring oscillator is indicative of a transistor speed of transistors in the memory cells, which in turn is indicative of a speed of the second memory array.

At S420, the IC is processed based on the speed of the ring oscillator. In an example, the IC is screened for a pass/fail test based on the speed of the ring oscillator. In another example, the frequency of the speed of the ring oscillator is used to bin ICs into different speed bins. In another example, the IC includes tunable components and one-time programmable (OTP) memory that are used for tuning internal circuits on the IC. Tuning parameters are determined based on the speed of the ring oscillator and stored in the OTP memory. The tunable components are adjusted based on the tuning parameters stored in the OTP memory, such as disclosed in Assignee's co-pending U.S. patent application Ser. No. 12/979,724, filed Dec. 28, 2010, which is incorporated herein by reference in its entirety. Then, the process proceeds to S599 and terminates.

Figure 5:
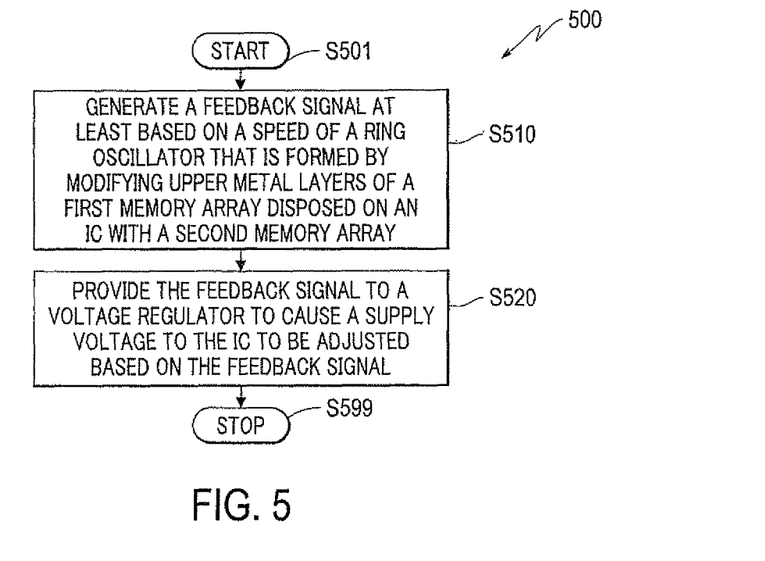
FIG. 5 shows a flow chart outlining a process 500 according to an embodiment of the disclosure.

FIG. 5 shows a flow chart outlining a process 500 according to an embodiment of the disclosure. The process starts at S501 and proceeds to S510.

At S510, an AVS module on an IC chip, such as the AVS module 191 in FIG. 1, generates a feedback signal at least partially based on a speed of a ring oscillator. The ring oscillator is formed by modifying upper metal layers of a first memory array. The ring oscillator is disposed on the IC chip with a second memory array. The memory cells in the second memory array have same patterns in layers up to a lower metal layer as the inversion stage in the ring oscillator, in an embodiment. Thus, transistor characteristics of the ring oscillator are about the same as the transistor characteristics of the memory cells, and the speed of the ring oscillator is indicative of a speed of transistors in the second memory array, which in turn is indicative of a memory speed of the second memory array.

In an embodiment, the IC chip includes a speed determination circuit to determine the speed of the ring oscillator. For example, the IC chip includes a counter that counts a number of inversions during a time period, such as during a clock cycle, and the like. Then, the number of inversions is indicative of inversion speed, and is indicative of memory speed. In an example, the AVS module generates the feedback signal based on the number of inversions during a clock cycle.

At S520, the feedback signal is provided to a voltage regulator to cause a supply voltage to the IC chip to be adjusted based on the feedback signal. In an embodiment, the feedback signal provided by the AVS is configured to govern the voltage from the voltage regulator to be at a level which causes the speed of the RO to be within an acceptable range of speeds. Then, the process proceeds to S599 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit, comprising:
a memory array defined by a plurality of memory cells that are based on a memory cell design;
a ring oscillator having a plurality of inversion stages formed of a plurality of modified memory cells based on the memory cell design, each inversion stage re a pair of differential inputs to gate terminals of transistors and generating a pair of differential outputs; and
a speed determination circuit configured to determine a speed of the ring oscillator.

2. The integrated circuit of claim 1, further comprising:
an adaptive voltage scaling module configured to generate a feedback signal based on the determined speed, the feedback signal being provided to a voltage regulator to cause the voltage regulator to adjust a supply voltage to the memory array based on the feedback signal.

3. The integrated circuit of claim 1, wherein the memory cell design is a six-transistor static random access memory (SRAM) cell design that includes two pass transistors coupled to bit lines, and a latch formed by two cross-coupled inverters.

4. The integrated circuit of claim 3, wherein the plurality of inversion stages are modified from a plurality of memory cells sharing bit lines.

5. The integrated circuit of claim 1, wherein the ring oscillator includes an odd number of inversion stages.

6. The integrated circuit of claim 1, wherein the inversion stages have a same pattern as the memory cells in circuit layers up to a metal layer.

7. The integrated circuit of claim 1, wherein the speed determination circuit is configured to count a number of inversions during a time interval.

8. The integrated circuit of claim 1, wherein the speed determination circuit is configured to determine a speed of the memory array based on the speed of the ring oscillator.

9. An apparatus, comprising:
a circuit that includes
a memory array defined by a plurality of memory cells that are based on a memory cell design,
a ring oscillator having a plurality of inversion stages formed of a plurality of modified memory cells based on the memory cell design, each inversion stage receiving a pair of differential inputs to gate terminals of transistors and generating a pair of differential outputs,
a speed determination circuit configured to determine a speed of the ring oscillator,
an adaptive voltage scaling module configured to generate a feedback signal based on the determined speed; and
a voltage regulator configured to adjust a supply voltage to the circuit based on the feedback signal.

10. The apparatus of claim 9, wherein the memory cell design is a six-transistor static random access memory (SRAM) cell design that includes two pass transistors coupled to bit lines, and a latch formed by two cross-coupled inverters.

11. The apparatus of claim 10, wherein the plurality of inversion stages are modified from a plurality of memory cells sharing bit lines.

12. The apparatus of claim 9, wherein the ring oscillator includes an odd number of inversion stages.

13. The apparatus of claim 9, wherein the inversion stages have have a same pattern as the memory cells in circuit layers up to a metal layer.

14. The apparatus of claim 9, wherein the speed determination circuit is configured to count a number of inversions in a time interval.

15. The apparatus of claim 9, wherein the speed determination circuit is configured to determine a speed of the memory array based on the speed of the ring oscillator.

16. A method, comprising:
measuring a speed of a ring oscillator that is formed by modifying metal layers of a first memory array disposed on an integrated circuit (IC) chip with a second memory array, the ring oscillator having a plurality of inversion stages, each inversion stage receiving a pair of differential inputs to gate terminals of transistors and generating a pair of differential outputs; and
using the measured speed as a memory speed indication of the second memory array.

17. The method of claim 16, further comprising:
binning the IC chip into one of a plurality of speed bins based on the measured speed.

18. The method of claim 16, further comprising:
using an internal circuit of the IC chip to control a performance of the second memory array based on the measured speed.

19. The method of claim 16, further comprising:
generating a feedback signal using an internal circuit of the IC chip at least partially based on the measured speed; and
providing the feedback signal to a voltage regulator to cause a supply voltage to the IC chip to be adjusted based on the feedback signal.

20. A method, comprising:
measuring a speed of a ring oscillator that is formed by modifying metal layers of a first memory array disposed on an integrated circuit (IC) chip with a second memory array, the ring oscillator having a plurality of inversion stages, each inversion stage receiving a pair of differential inputs to gate terminals of transistors and generating a pair of differential outputs;
using the measured speed as a memory speed indication of the second memory array; and
binning the IC chip into one of a plurality of speed bins based on the measured speed.

* * * * *